(12) United States Patent
Wu

(10) Patent No.: US 6,552,386 B1
(45) Date of Patent: Apr. 22, 2003

(54) SCALABLE SPLIT-GATE FLASH MEMORY CELL STRUCTURE AND ITS CONTACTLESS FLASH MEMORY ARRAYS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 10/262,200

(22) Filed: Sep. 30, 2002

(51) Int. Cl.$^7$ ............................................. H01L 29/788
(52) U.S. Cl. ......................... 257/317; 257/316; 257/321
(58) Field of Search ................... 257/315, 316, 257/317, 321

(56) References Cited

U.S. PATENT DOCUMENTS 6,433,384 B1 * 8/2002 Hashimoto .................. 257/316
6,462,375 B1 * 10/2002 Wu ............................. 257/316
2002/0096704 A1 * 7/2002 Fukumoto et al. .......... 257/315

* cited by examiner

Primary Examiner—Ngân V. Nô
(74) Attorney, Agent, or Firm—Pro-Techtor International Services

(57) ABSTRACT

A scalable split-gate flash memory cell structure of the present invention comprises a common-source region, a scalable split-gate region being formed by a sidewall dielectric spacer, and a scalable common-drain region, wherein the scalable split-gate region comprising a floating-gate region being defined by another sidewall dielectric spacer has a tip-cathode line for erasing. The cell size of the present invention is scalable and can be made to be equal to $4F^2$ or smaller. The scalable split-gate flash memory cell structure is used to implement two contactless flash memory arrays: a contactless NOR-type flash memory array and a contactless parallel common-source/drain conductive bit-lines flash memory array for high speed read/write/erase operations. Moreover, the contactless flash memory arrays can be fabricated with less critical masking steps as compared to the prior art.

20 Claims, 10 Drawing Sheets

SCALABLE SPLIT-GATE FLASH MEMORY CELL STRUCTURE AND ITS CONTACTLESS FLASH MEMORY ARRAYS

FIELD OF INVENTION

The present invention relates to a split-gate flash memory cell and its flash memory array and, more particularly, to a scalable split-gate flash memory cell having a controllable tip-cathode floating-gate structure and its contactless flash memory arrays.

DESCRIPTION OF THE RELATED ART

The split-gate flash memory cell structure having a select-gate region and a gate-stack region offers in general a larger cell size as compared to that of a stack-gate flash memory cell structure and is usually configured to be a NOR-type array. Two typical split-gate flash memory cell structures are shown in FIG. 1A and FIG. 1B.

FIG. 1A shows a split-gate flash memory cell structure having a floating-gate layer 11 formed by a local oxidation of silicon (LOCOS) technique, in which the floating-gate length is defined in general to be larger than a minimum-feature-size (F) of technology used due to the bird's beak formation at two gate edges; a control-gate layer 15 is formed over a part of a LOCOS-oxide layer 12 and a thicker select-gate oxide layer 14; a poly-oxide layer 13 is formed over a sidewall of the floating-gate layer 11; a source diffusion region 16 and a drain diffusion region 17 are formed in a semiconductor substrate 100 in a self-aligned manner; and a thin gate-dielectric layer 10 is formed under the floating-gate layer 11. The split-gate flash memory cell structure shown in FIG. 1A is programmed by mid-channel hot-election injection, the programming efficiency is higher and the programming power is lower as compared to the channel hot-electron injection used by the stack-gate flash memory cell structure. Moreover, the over-erase problem of the split-gate flash memory cell structure can he prevented due to a high threshold-voltage of the select-gate transistor in the select-gate region, so the control logic circuits for erasing and verification can be simplified. However, there are several drawbacks for FIG. 1A: the cell size is larger due to a non-self-aligned control-gate structure; the gate length can't be easily scaled due to the misalignment of the control-gate layer 15 with respect to the floating-gate layer 11; the coupling ratio is low and higher applied control-gate voltage is required for erasing; the field-emission tip of the floating-gate layer 11 is difficult to be controlled due to the weak masking ability of the bird's beak of the LOCOS oxide layer 12; and a high-temperature oxidation process is required to form a LOCOS-oxide layer 12 with an appreciate tip.

FIG. 1B shows another split-gate flash memory cell structure, in which a floating-gate layer 21 is defined by a minimum-feature-size (F) of technology used; a thin tunneling-oxide layer 20 is formed under the floating-gate layer 21; a select-gate oxide layer 22 is formed over a semiconductor substrate of the select-gate region and an exposed floating-gate layer 21; a control-gate layer 23 is formed above a portion of the floating-gate layer 21 and the select-gate region; and a source diffusion region 24 and a double-diffused drain structure 25/26 are formed in a semiconductor substrate 100. From FIG. 1B, it is clearly visualized that similar drawbacks are appeared except that the erasing site is located at the thin tunneling-oxide layer 20 between the floating-gate layer 21 and the double-diffused drain structure 25/26. Apparently, the double-diffused drain structure 25/26 is mainly used to eliminate the band-to-band tunneling effect and becomes an obstacle for further scaling.

It is, therefore, an objective of the present invention to provide a scalable split-gate flash memory cell structure with a scalable cell size being equal to or smaller than $4F^2$.

It is another objective of the present invention to provide a controllable tip-cathode structure for the scalable split-gate flash memory cell with a higher erasing efficiency.

It is a further objective of the present invention to provide a manufacturing method with less critical masking steps.

It is yet another objective of the present invention to provide two contactless array architectures for high-speed operations with less power consumption.

SUMMARY OF THE INVENTION

A scalable split-gate flash memory cell structure of the present invention is fabricated on a semiconductor substrate of a first conductivity type with an active region being formed between two shallow-trench-isolation (STI) regions and comprises a common-source region, a scalable split-gate region, and a scalable common-drain region, wherein the scalable split-gate region is formed between the common-source region and the scalable common-drain region. The common-source region comprises a common-source diffusion region of a second conductivity type being formed in the active region, a first sidewall dielectric spacer being formed over an outer sidewall of the scalable split-gate region and on a portion of a flat surface being formed by a tunneling-dielectric layer in the active region and two fourth raised field-oxide layers in the two STI regions, a common-source conductive bus-line being formed over a first flat bed outside of the first sidewall dielectric spacer, and a first planarized thick-oxide layer being formed over the common-source conductive bus-line, wherein the common-source diffusion region comprises a shallow heavily-doped common-source diffusion region being formed within a lightly-doped common-source diffusion region and the first flat bed comprises the shallow heavily-doped common-source diffusion in the active region and two fifth raised field-oxide layers in the two STI regions. The scalable split-gate region being defined by a third sidewall dielectric spacer formed over an outer sidewall of the common-source region comprises a floating-gate region being defined by a second sidewall dielectric spacer formed over the outer sidewall of the common-source region and a select-gate region being formed outside of the floating-gate region, wherein a floating-gate layer over a thin tunneling-dielectric layer is formed over the semiconductor substrate in the active region of the floating-gate region and a portion of a control-gate conductive layer over a gate-dielectric layer is formed over an implant region of the first conductivity type in the active region of the select-gate region. The implant region comprises a shallow implant region for threshold-voltage adjustment of the select-gate transistor and a deep implant region for forming a punch-through stop. The floating-gate layer comprises a tip-cathode line being formed between a first thermal poly-oxide layer formed over an outer sidewall of the floating-gate layer near the select-gate region and a refilled-oxide layer formed over an upper corner portion of the floating-gate layer near the common-source region, and a second thermal poly-oxide layer being formed over the tip-cathode line as a tunneling-dielectric layer. A control-gate conductive layer capped with a capping control-gate conductive layer is formed over the floating-gate region and the select-gate region in the scalable split-gate region to act as a conductive word-line for forming a first-type scalable split-gate flash memory cell of the present invention, wherein a planarized capping-oxide layer is formed over the capping control-gate conductive layer. A metal word-line integrated with a planarized control-gate conductive island over a control-gate conductive island is patterned to be aligned above the active region for forming a second-type scalable split-gate flash memory cell of the present invention, wherein the control-gate conductive island is formed over the floating-gate layer in the floating-gate region and the gate-dielectric layer in the select-gate region. The scalable common-drain region comprises a common-drain diffusion region of the second conductivity type and a fourth sidewall dielectric spacer being formed over another sidewall of the scalable split-gate region and on a portion of second flat bed, wherein the common-drain diffusion region comprises a shallow heavily-doped common drain diffusion region being formed within a lightly-doped common-drain diffusion region and the second flat bed comprises the shallow heavily-doped common-drain diffusion region being formed in the active region and two sixth raised field-oxide layers in the two STI regions. A metal bit-line integrated with a planarized common-drain conductive island is patterned to be aligned above the active region for forming the first-type scalable split-gate flash memory cell of the present invention, wherein the planarized common-drain conductive island is formed over the shallow heavily-doped common-drain diffusion region outside of the fourth sidewall dielectric spacer. A common-drain conductive layer capped with a capping common-drain conductive layer is formed over the second flat bed outside of the fourth sidewall dielectric spacer for forming the second-type scalable split-gate flash memory cell of the present invention, wherein a second planarized thick-oxide layer is formed over the capping common-drain conductive layer.

The scalable split-gate flash memory cell structure of the present invention is used to implement two contactless flash memory arrays: a contactless NOR-type flash memory array and a contactless parallel common-source/drain conductive bit-lines flash memory array. The contactless NOR-type flash memory array comprises a plurality of active regions and a plurality of STI regions being alternately formed on a semiconductor substrate of a first conductivity type, a plurality of first-type scalable flash memory cells being formed over the semiconductor substrate, a plurality of common-source conductive bus-lines being formed transversely to the plurality of active regions, a plurality of conductive word-lines being formed transversely to the plurality of active regions, and a plurality of metal bit-lines integrated with the planarized common-drain conductive islands of the plurality of first-type scalable split-gate flash memory cells being formed transversely to the plurality of conductive word-lines. The contactless parallel common-source/drain conductive bit-lines flash memory array of the present invention comprises a plurality of active regions and a plurality of STI regions being alternately formed on a semiconductor substrate of a first conductivity type, a plurality of second-type split-gate scalable flash memory cells being formed over the semiconductor substrate, a plurality of common-source conductive bit-lines and a plurality of common-drain conductive bit-lines being formed alternately and transversely to the plurality of active regions, a plurality of metal word-lines integrated with the planarized control-gate conductive islands over the control-gate conductive islands being formed transversely to the plurality of common-source/drain conductive bit-lines.

The unit cell size of the contactless flash memory arrays is scalable and can be fabricated to be equal to $4F^2$ or smaller and the critical masking steps used are less than those of the prior art.

BRIEF DESCRIPTION OF THE DRAWINGS

FIG. 1A and FIG. 1B show the schematic diagrams of the prior art, in which FIG. 1A shows a cross-sectional view of a split-gate flash memory cell with a tip-cathode floating-gate structure formed by a LOCOS technique; FIG. 1B shows a cross-sectional view of a split-gate flash memory cell with a source-side erase structure.

FIG. 6A and FIG. 6B show the top plan views of the present invention, in which FIG. 6A shows a top plan view of a contactless NOR-type flash memory array and FIG. 6B shows a top plan view of a contactless parallel common-source/drain conductive bit-lines flash memory array.

DETAILED DESCRIPTION OF THE PREFERRED EMBODIMENTS

Figure 1A:
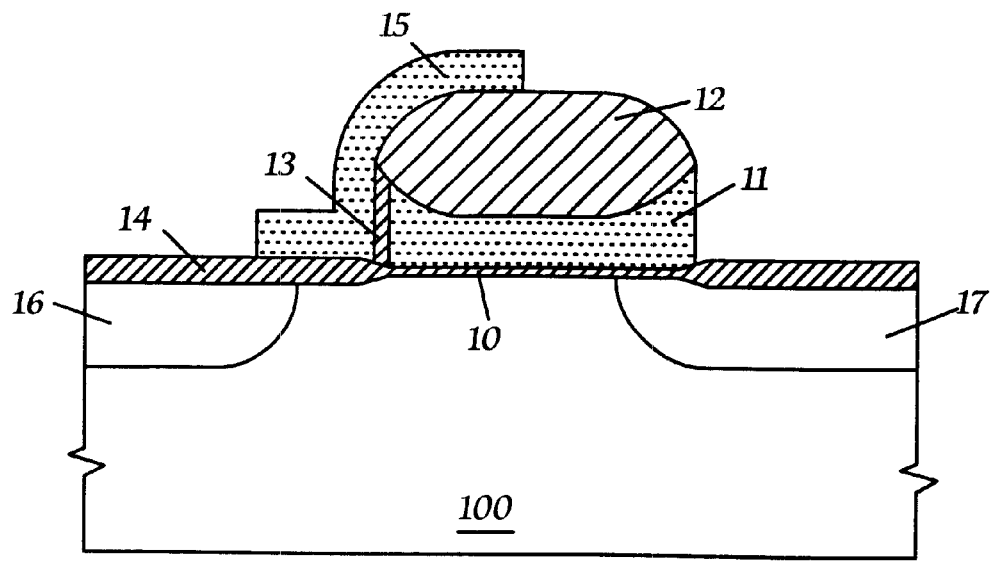
Figure 1B:
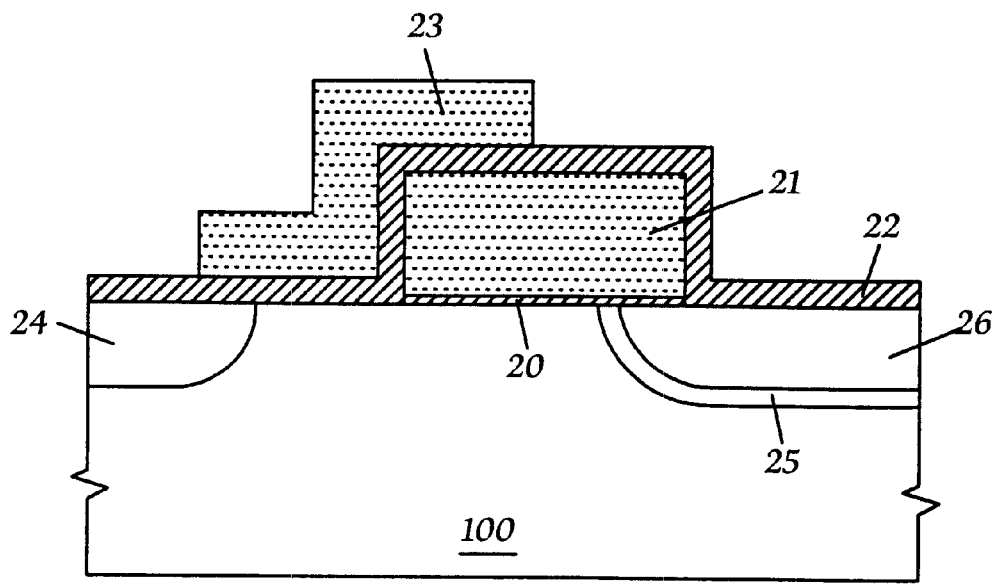
Figure 2A:
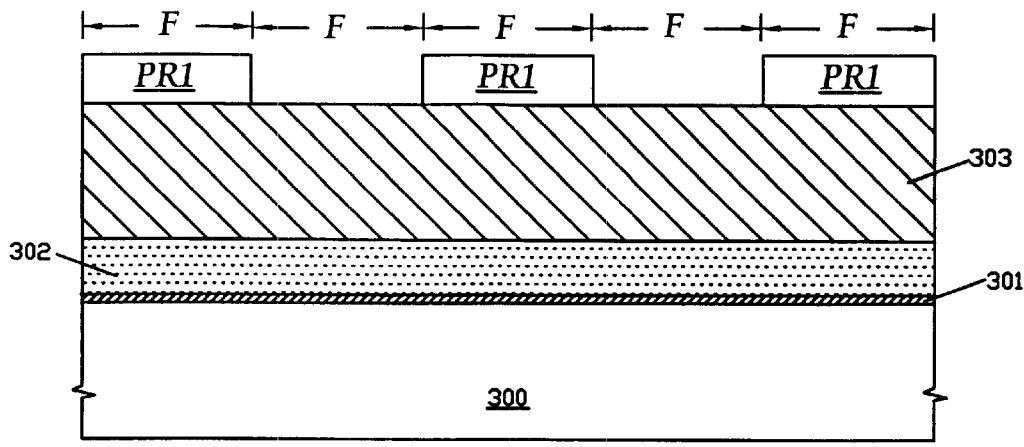
FIG. 2A through FIG. 2C show the process steps and their cross-sectional views of forming a shallow-trench-isolation structure for a scalable split-gate flash memory cell structure and its contactless flash memory arrays of the present invention.
Figure 2B:
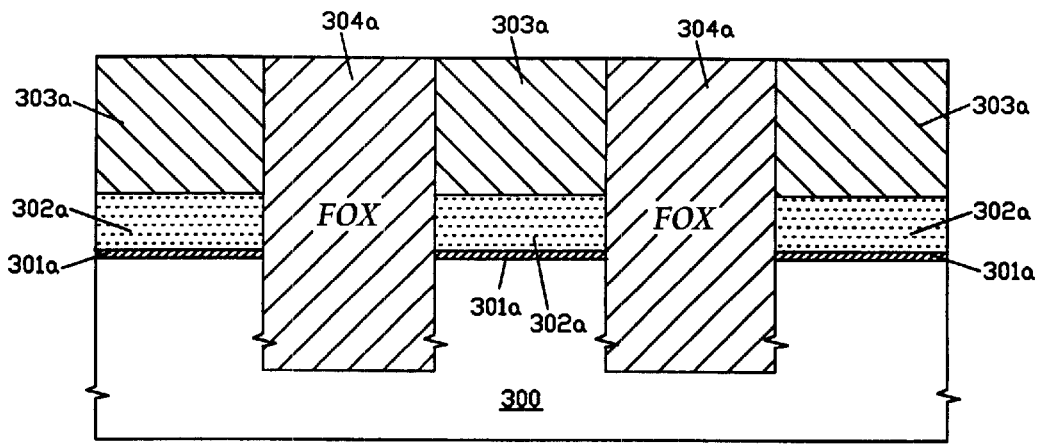
Figure 2C:
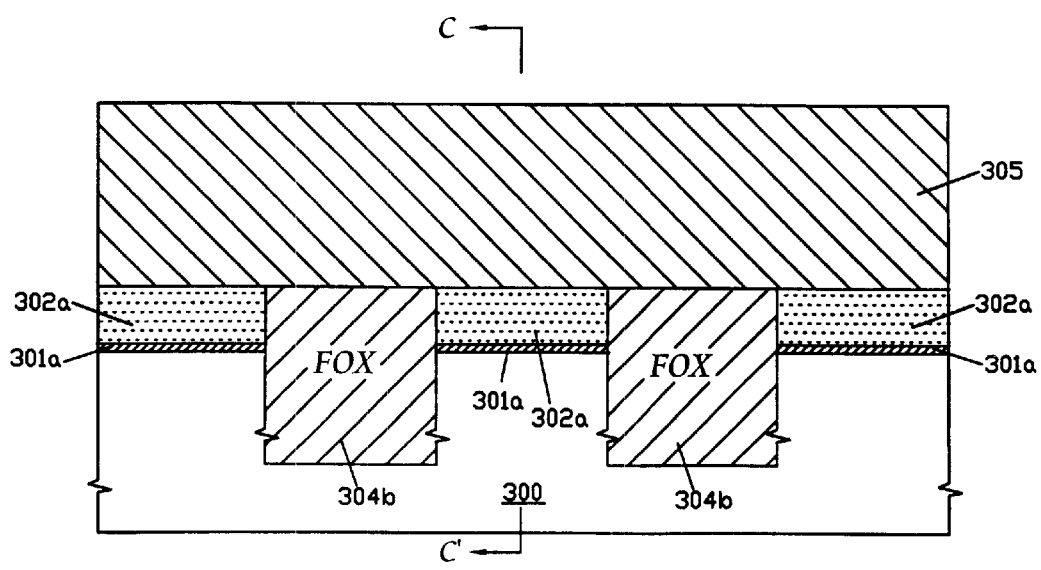

Referring now to FIG. 2A through FIG. 2C, there are shown the process steps and their cross-sectional views of forming a shallow-trench-isolation (STI) structure for a scalable split-gate flash memory cell structure and its contactless flash memory arrays of the present invention.

FIG. 2A shows that a thin tunneling-dielectric layer 301 is formed over a semiconductor substrate 300 of a conductivity type; a conductive layer 302 is formed over the thin tunneling-dielectric layer 301; a first masking dielectric layer 303 is then formed over the first conductive layer 302; and subsequently, a plurality of masking photoresist PR1 are formed over the first masking dielectric layer 303 to define a plurality of active regions (AA) (under PR1) and a plurality of shallow-trench-isolation (STI) regions (between PR1). The thin tunneling-dielectric layer 301 is preferably a thermal silicon-dioxide layer or a nitrided thermal silicon-dioxide layer and its thickness is preferably between 70 Angstroms and 120 Angstroms. The conductive layer 302 is preferably a doped polycrystalline-silicon or amorphous-silicon layer as deposited by low-pressure chemical-vapor-deposition (LPCVD) and its thickness is preferably between 1500 Angstroms and 4000 Angstroms. The first masking dielectric layer 303 is preferably made of silicon-nitride as deposited by LPCVD and its thickness is preferably between 1000 Angstroms and 3000 Angstroms. It should be noted that a width and a space of the plurality of masking photoresist PR1 can be defined to be equal to a minimum-feature-size (F) of technology used, as shown in FIG. 2A.

FIG. 2B shows that the first masking dielectric layer 303, the conductive layer 302, and the thin tunneling-dielectric layer 301 between the plurality of masking photoresist PR1 are sequentially removed by anisotropic dry etching and the semiconductor substrate 300 between the plurality of masking photoresist PR1 is then anisotropically etched to form a plurality of shallow trenches; and subsequently, the plurality of masking photoresist PR1 are stripped. FIG. 2B also shows that a planarized field-oxide layer 304a is formed to fill up each gap between the first masking dielectric layers 303a. The planarized field-oxide layer 304a is preferably made of silicon-dioxide, phosphorous-silicate glass (P-glass), or borophosphorous-silicate glass (BP-glass) as deposited by LPCVD, high-density plasma (HDP) CVD, or plasma-enhanced (PE) CVD, and is formed by first depositing a thick-oxide film 304 to fill up each gap between the first masking dielectric layers 303a and then planarizing the deposited thick-oxide film 304 using chemical-mechanical polishing (CMP) with the first masking dielectric layer 303a as a polishing stop.

FIG. 2C shows that the planarized field-oxide layers 304a are selectively etched back to a depth equal to a thickness of the first masking dielectric layer 303a by using anisotropic dry etching; the first masking dielectric layers 303a are then removed by hot-phosphoric acid or anisotropic dry etching to form a flat surface being alternately formed by a first raised field-oxide layer 304b and the conductive layer 302a; and subsequently, a second masking dielectric layer 305 is formed over the flat surface. The second masking dielectric layer 305 is preferably made of silicon-nitrides as deposited by LPCVD and its thickness is preferably between 5000 Angstroms and 15000 Angstroms. The cross-sectional view along an active region as indicated by a C—C' line shown in FIG. 2C is shown in FIG. 3A.

It should be emphasized that there are several methods that can be used to form the flat surface shown in FIG. 2C. For examples, the first masking dielectric layer 303 can be made of silicon-dioxide as deposited by LPCVD, and the first masking dielectric layers 303a and the deposited thick-oxide film 304 can be planarized simultaneously by a CMP technique; the plurality of masking photoresist PR1 can be directly formed over the conductive layer 302, the plurality of shallow trenches are then patterned without the first masking dielectric layer 303, and the first raised field-oxide layers 304b can be formed by using CMP. However, the proposed process as shown in FIG. 2A through FIG. 2C is favorable for forming a liner-oxide layer over the trench surface to eliminate the trench-induced defects.

Referring now to FIG. 3A through FIG. 3J, there are shown the process steps and their cross-sectional views of forming a common plateform structure for a scalable split-gate flash memory cell structure and its contactless flash memory arrays of the present invention.

Figure 3A:
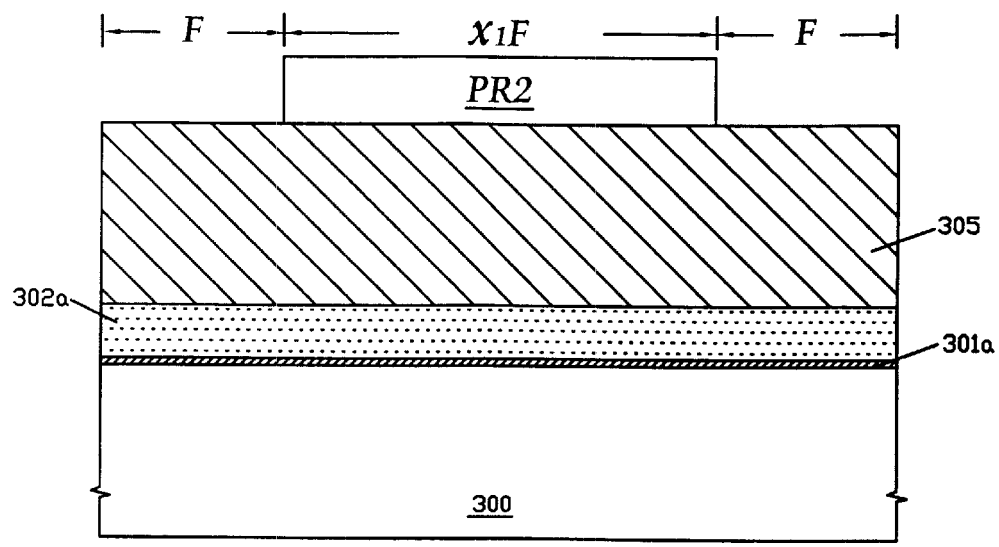
FIG. 3A through FIG. 3J show the process steps and their cross-sectional views of forming a common platform structure for a scalable split-gate flash memory cell structure and its contactless flash memory arrays of the present invention.

FIG. 3A shows that a plurality of masking photoresist PR2 are formed over the second masking dielectric layer 305 to define a plurality of scalable regions (under PR2) and a plurality of common-source regions (between PR2), wherein each of the plurality of scalable regions as indicated by $X_1F$ comprises a pair of scalable split-gate regions and a scalable common-drain region being formed between the pair of split-gate regions and the common-source region as indicated by F can be defined to be a minimum-feature-size (F) of technology used. It should be noted that $X_1$ is a scaling factor. If $X_1$ is equal to 3, the unit cell size of a scalable split-gate flash memory cell structure of the present invention is equal to $4F^2$. In general, the unit cell size is equal to $(1+X_1)F^2$ and is scalable through $X_1$.

Figure 3B:
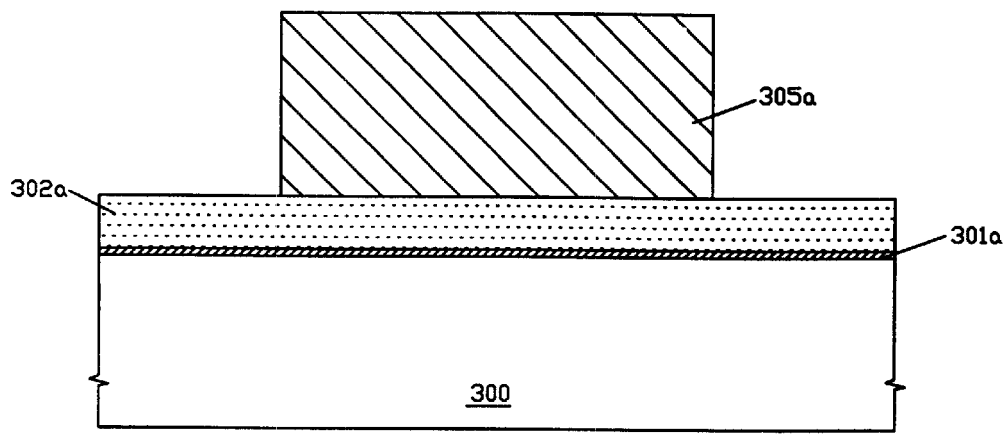

FIG. 3B shows that the second masking dielectric layers 305 between the plurality of masking photoresist PR2 are selectively removed by anisotropic dry etching and the plurality of masking photoresist PR2 are then stripped.

Figure 3C:
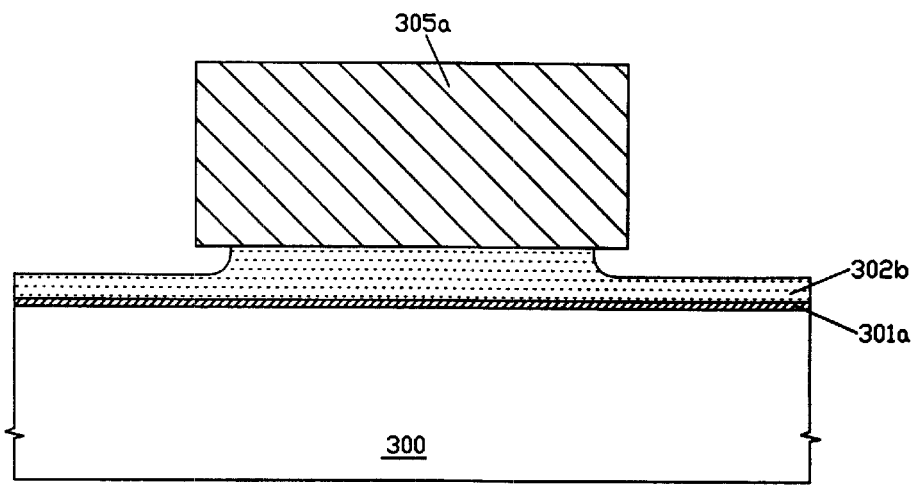

FIG. 3C shows that the conductive layer 302a in each of the plurality of common-source regions is etched isotropically by using either wet etching or isotropic dry etching to form a pair of undercutting shapes in each of the plurality of scalable regions. It should be noted that the undercutting shapes can also be obtained by a conventional oxidation process and the formed oxide layers are then removed by wet etching.

Figure 3D:
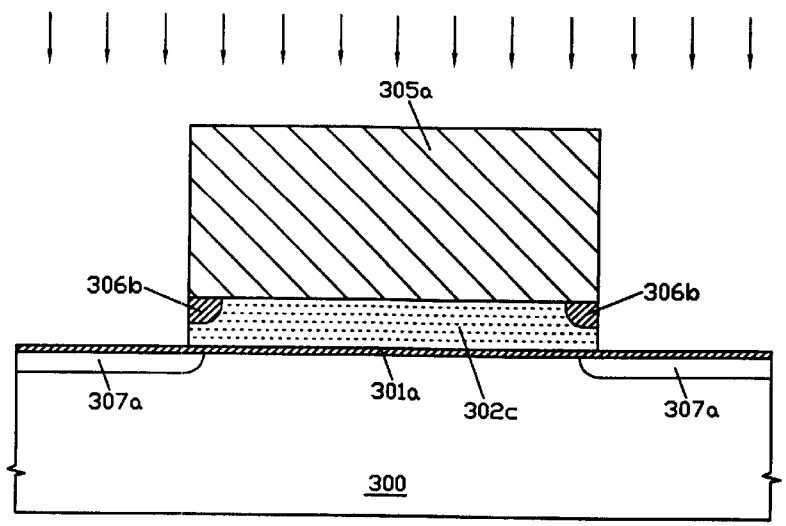

FIG. 3D shows that the undercutting holes are filled with the refilled-oxide layer 306b, the first raised field-oxide layers 304b and the remained conductive layer 302b in each of the plurality of common-source regions are sequentially etched to form a flat surface being alternately formed by the thin tunneling-dielectric layer 301a and a fourth raised field-oxide layer 304e. The refilling process for the undercutting holes can be easily obtained by first depositing a thick-oxide film 306 to fill up each gap between the second masking dielectric layers 305a, then planarizing the deposited thick-oxide film 306 using CMP with the second masking dielectric layer 305a as a polishing stop and thereafter, etching back selectively the planarized thick-oxide layers 306a using anisotropic dry etching to a top surface level of the remained conductive layer 302b and etching back the first raised field-oxide layers 304b to a top surface level of the thin tunneling-dielectric layer 301a to form the fourth raised field-oxide layers 304e, and thereafter, removing selectively the remained conductive layers 302b in each of the plurality of common-source regions. FIG. 3D also shows that an ion-implantation process is performed by implanting doping impurities across the thin tunneling-dielectric layer 301a into the semiconductor substrate 300 in a self-aligned manner to form a lightly-doped common-source diffusion region 307a of a second conductivity type in each of the plurality of active regions.

Figure 3E:
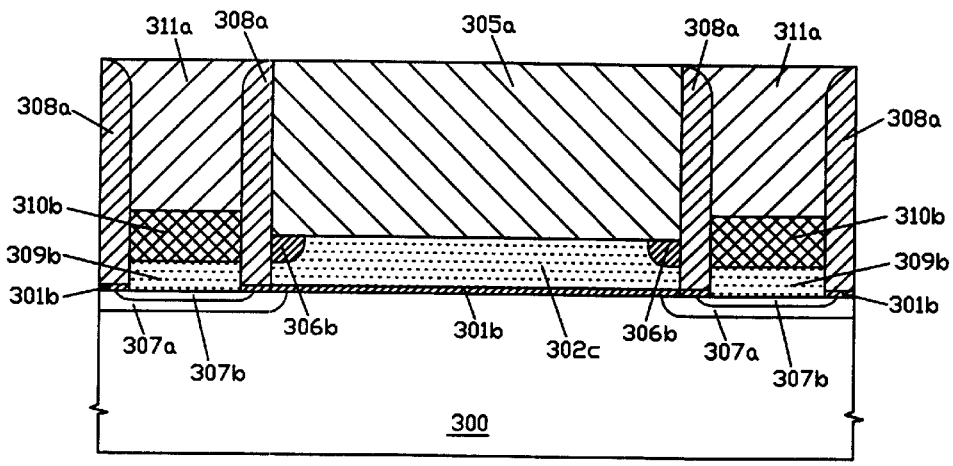

FIG. 3E shows that a pair of first sidewall dielectric layers 308a are formed over outer sidewalls of nearby scalable regions and on a portion of the flat surface being alternately formed by the thin tunneling-dielectric layer 301b and the fourth raised field-oxide layer 304e; the thin tunneling-dielectric layers 301a between the pair of first sidewall dielectric spacers 308a are removed by anisotropic dry etching or dipping in a dilute hydrofluoric acid solution and the fourth raised field-oxide layers 304e are simultaneously etched to form a first flat bed being alternately formed by a fifth raised field-oxide layer 304f and the lightly-doped common-source diffusion region 307a in each of the plurality of common-source regions; a composite conductive layer 310b/309b is then formed over the first flat bed in each of the plurality of common-source regions to act as a common-source conductive bus-line 310b/309b; and subsequently, a first planarized thick-oxide layer 311a is formed to fill up each gap between the pair of first sidewall dielectric spacers 308a. The first sidewall dielectric spacer 308a is preferably made of silicon-dioxide as deposited by LPCVD and is formed by first depositing a silicon-dioxide layer 308 and then etching back anisotropically the deposited silicon-dioxide layer 308 to a thickness of the deposited silicon-dioxide layer 308. It should be noted that before etching back the deposited silicon-dioxide layer 308, an ion-implantation process can be performed by implanting a high dose of doping impurities across the deposited silicon-dioxide layer 308 and the thin tunneling-dielectric layer 301a into the semiconductor substrate 300 in a self-aligned manner to form a shallow heavily-doped common-source diffusion region 307b of the second conductivity type within the lightly-doped common-source diffusion region 307a. The composite conductive layer 310b/309b comprises a doped polycrystalline-silicon layer 309b as deposited by LPCVD and a capping common-source conductive layer 310b such as a tungsten-disilicide (WSi$_2$) or tungsten (W) layer deposited by LPCVD or sputtering. The doped polycrystalline-silicon layer 309b can be further implanted with a high dose of doping impurities to act as a dopant diffusion source for forming a shallow heavily-doped common-source diffusion region 307b of the second conductivity type within the lightly-doped common-source diffusion region 307a and is formed by first depositing a thick doped polycrystalline-silicon layer 309, then planarizing the deposited doped polycrystalline-silicon layer 309 using CMP with the second masking dielectric layer 305a as a polishing stop, and thereafter etching back the planarized doped polycrystalline-silicon layer 309a to a predetermined thickness. Similarly, the capping common-source conductive layer 310b can be formed by the same steps as those of the doped polycrystalline-silicon layer 309b. The first planarized-tick-oxide layer 311a is preferably made of silicon-dioxide, P-glass, or BP-glass as deposited by LPCVD, HDPCVD, or PECVD and is formed by first depositing a thick-oxide film 311 to fill up each gap between the pair of first sidewall dielectric spacers 308a and then planarizing the deposited thick-oxide layer 311 using CMP with the second masking dielectric layer 305a as a polishing stop.

Figure 3F:
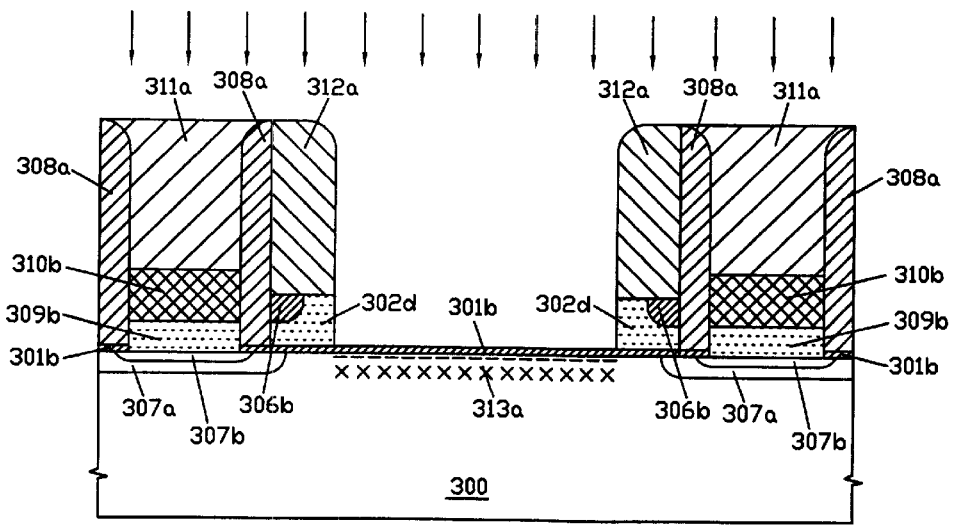

FIG. 3F shows that the second masking dielectric layers 305a are selectively removed by hot-phosphoric acid or anisotropic dry etching; a pair of second sidewall dielectric spacers 312a are formed over outer sidewalls of nearby first sidewall dielectric spacers 308a to define the widths of a pair of floating-gate regions 302d, and the conductive layers 302c between the pair of second sidewall dielectric spacers 312a are selectively removed by using anisotropic dry etching; and subsequently, an ion-implantation process is performed in a self-aligned manner by implanting doping impurities across the thin tunneling-dielectric layers 301b into the semiconductor substrate 300 in each of the plurality of active regions between the pair of second sidewall dielectric spacers 312a to form the implant region 313a of the first conductivity type. The second sidewall dielectric spacer 312a is preferably made of silicon-nitride as deposited by LPVCD and is formed by first depositing a silicon-nitride layer 312 over a formed structure surface and then etching back a thickness of the deposited silicon-nitride layer 312. The implant region 313a comprises a shallow implant region as indicated by a dashed line for threshold-voltage adjustment of the select-gate transistors in the select-gate region and a deep implant region as indicated by the cross symbols for forming punch-through stops of the select-gate transistors.

Figure 3G:
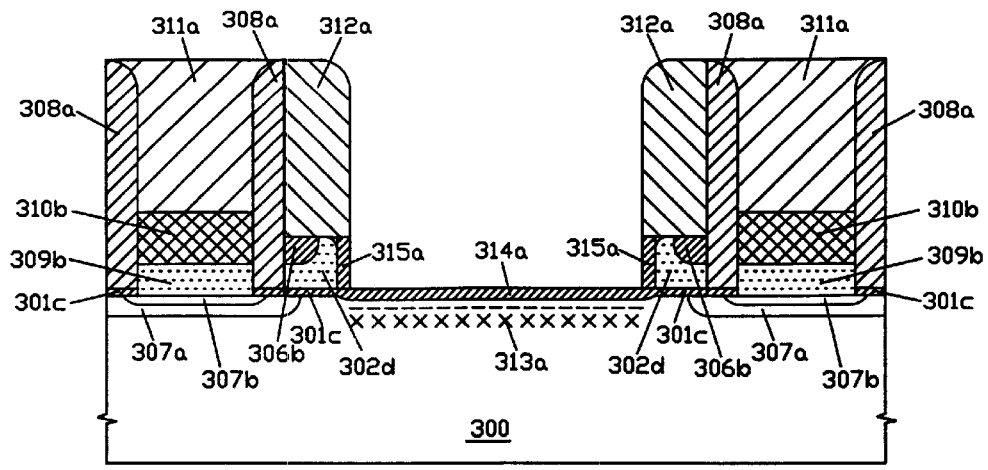

FIG. 3G shows that the thin tunneling-dielectric layers 301b can be removed by dipping in a dilute hydrofluoric acid solution or anisotropic dry etching and the first raised field-oxide layers 304b in the plurality of STI regions are slightly etched to form second raised field-oxide layers 304c and a thermal-oxidation process can be performed to form a gate-dielectric layer 314a over each of the plurality of active regions between the pair of second sidewall dielectric spacers 312a and a first thermal poly-oxide layer 315a is formed over each sidewall of the floating-gate layers 302d. It should be noted that the thin tunneling-dielectric layers 301b may not be removed and the oxidation process is then performed. It is clearly seen that a sharp tip-cathode line is formed in each of the plurality of floating-gate layers 302d. The width of the sharp tip-cathode line is mainly controlled by the first thermal poly-oxide layer 315a and the refilled-oxide layer 306b and is preferably between 100 Angstroms and 300 Angstroms.

Figure 3H:
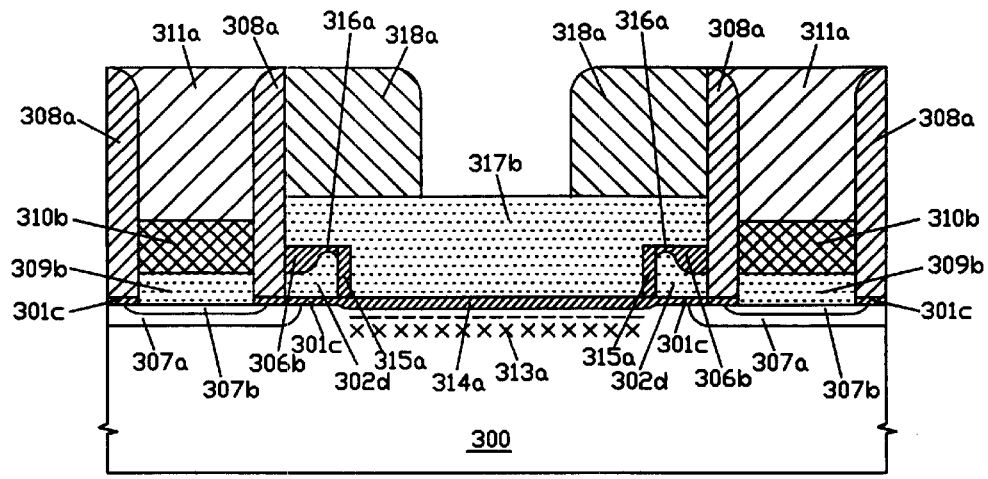

FIG. 3H shows that the pair of second sidewall dielectric spacers 312a are selectively removed by using hot-phosphoric acid; a thermal-oxidation process is performed to form a second thermal poly-oxide layer 316a over each of the sharp tip-cathode lines and a thermal annealing process in a N$_2$O ambient can be performed to form the nitided first/second thermal poly-oxide layers 315a/316a and the nitrided gate-dielectric layer 314a; a control-gate conductive layer 317b is then formed in each of the plurality of scalable regions; and subsequently, a pair of third sidewall dielectric spacers 318a are formed over outer sidewalls of the pair of first sidewall dielectric spacers 308a and on a portion of the control-gate conductive layers 317b to define a pair of scalable split-gate regions and simultaneously define a scalable common-drain region being located between the pair of scalable split-gate regions in each of the plurality of scalable regions. The thickness of the nitrided second thermal poly-oxide layer 316a is preferably between 70 Angstroms and 200 Angstroms and the thickness of the nitrided first thermal poly-oxide layer 315a is preferably between 200 Angstroms and 300 Angstroms. The control-gate conductive layer 317b is preferably made of doped polycrystalline-silicon as deposited by LPCVD and is formed by first depositing a thick doped polycrystalline-silicon layer 317, then planarizing the deposited doped polycrystalline-silicon layer 317 using CMP or etching-back, and thereafter etching back to a predetermined thickness. The third sidewall dielectric spacer 318a is preferably made of silicon-nitrides as deposited by LPCVD and is formed by first depositing a silicon-nitride layer 318 and then etching back to a thickness of the deposited silicon-nitride layer 318. It should be noted that the spacer width of the third sidewall dielectric spacers 318a is mainly used to determine the width of the scalable split-gate region and is controlled by the thickness of the deposited silicon-nitride layer 318. Therefore, the control-gate width of a scalable split-gate region is scalable. It should be emphasized that the control-gate conductive layer 317b can be a composite conductive layer with a doped polycrystalline-silicon layer capped with a tungsten-disilicide (WSi$_2$) or tungsten (W) layer.

Figure 3I:
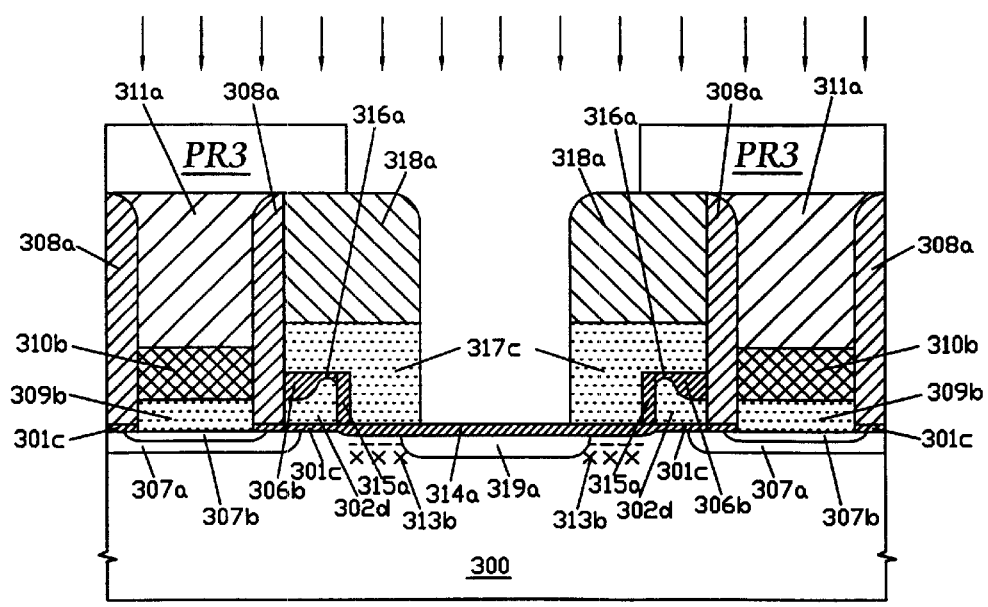

FIG. 3I shows that a plurality of masking photoresist PR3 are formed over the plurality of common-source regions and a portion of nearby scalable split-gate regions; the control-gate conductive layer 317b between the pair of third sidewall dielectric spacers 318a in each of the plurality of scalable regions is first etched back to a top surface level of the second raised field-oxide layers 304c, the second raised field-oxide layers 304c are then etched back to a top surface level of the gate-dielectic layer 314a, and the remained control-gate conductive layers are removed anisotropically to form a flat surface being formed alternately by the gate-dielectric layer 314a and the third raised field-oxide layer 304d; an ion-implantation process is performed in a self-aligned manner by implanting doping impurities across the gate-dielectric layer 314a into the semiconductor substrate 300 to form a lightly-doped common-drain diffusion region 319a of the second conductivity type in each of the plurality of active regions between the pair of third sidewall dielectric spacers 318a.

Figure 3J:
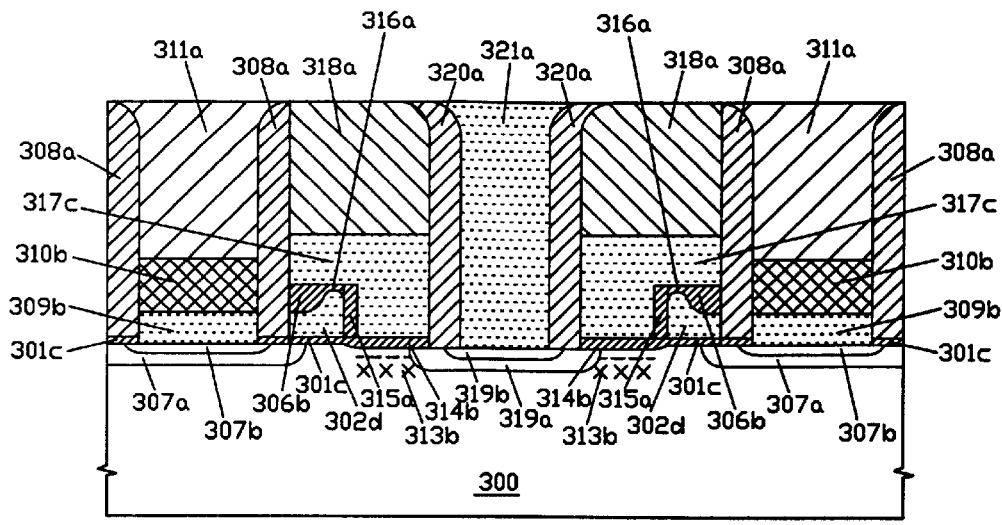

FIG. 3J shows the gate-dielectric layers 314a between the pair of third sidewall dielectric spacers 318a are removed by dipping in a dilute hydrofluoric acid or anisotropic dry etching and the third raised field-oxide layers 304d are simultaneously etched to form a second flat bed; and subsequently, the plurality of masking photoresist PR3 are stripped. FIG. 3J also shows that a pair of fourth sidewall dielectric spacers 320a are formed over outer sidewalls of nearby scalable split-gate regions and on a portion of the second flat bed. It should be noted that before etching back the deposited dielectric layer 320 to form the fourth sidewall dielectric spacers 320a, an ion-implantation process is performed by implanting a high dose of doping impurities across the deposited dielectric layer 320a into the semiconductor substrate in a self-aligned manner to form a shallow heavily-doped common-drain diffusion region 319b of the second conductivity type within the lightly-doped common-drain diffusion region 319a in each of the plurality of active regions. Therefore, the second flat bed is alternately formed by the shallow heavily-doped common-drain diffusion region 319b and a sixth raised field-oxide layer 304g. FIG. 3J further shows that a planarized common-drain conductive layer 321a is formed over the second flat bed to fill up each gap between the pair of fourth sidewall dielectric spacers 320a in each of the plurality of scalable common-drain regions. The fourth sidewall dielectric spacer 320a is preferably made of silicon-dioxide as deposited by LPCVD and is formed by first depositing a silicon-dioxide layer 320 over a formed structure surface and then etching back to a thickness of the deposited silicon-dioxide layer 320. The planarized common-drain conductive layer 321a is preferably made of doped polycrystalline-silicon as deposited by LPCVD and is formed by first depositing a thick conductive layer 321 to fill up each gap between the pair of fourth sidewall dielectric spacers 320a and then planarizing the deposited thick conductive layer 321 using CMP with the pair of third sidewall dielectric spacers 318a as a polishing stop. It should be emphasized that FIG. 3I forms a common platform structure for fabricating a scalable split-gate flash memory cell structure and its contactless flash memory arrays of the present invention.

Figure 4A:
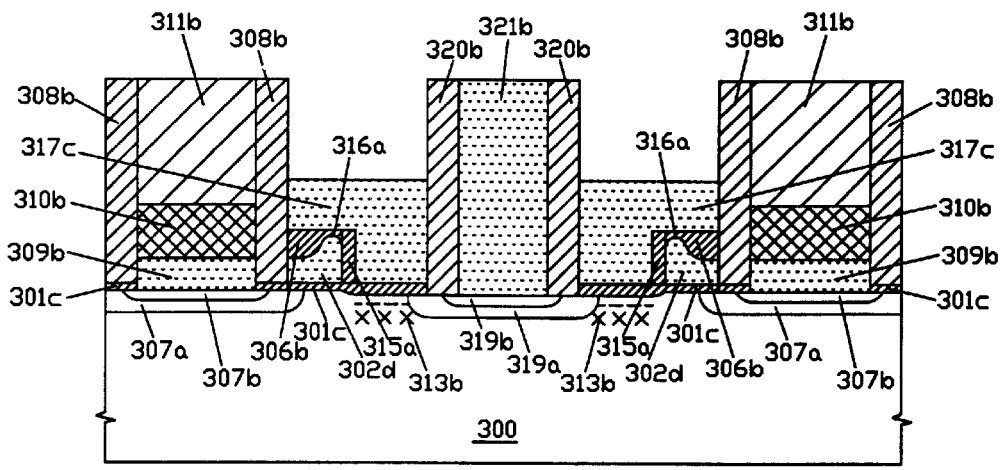
FIG. 4A through FIG. 4C show the process steps and their cross-sectional views for forming a scalable split-gate flash memory cell structure and its contactless NOR-type flash memory array of the present invention after FIG. 3J.
Figure 4B:
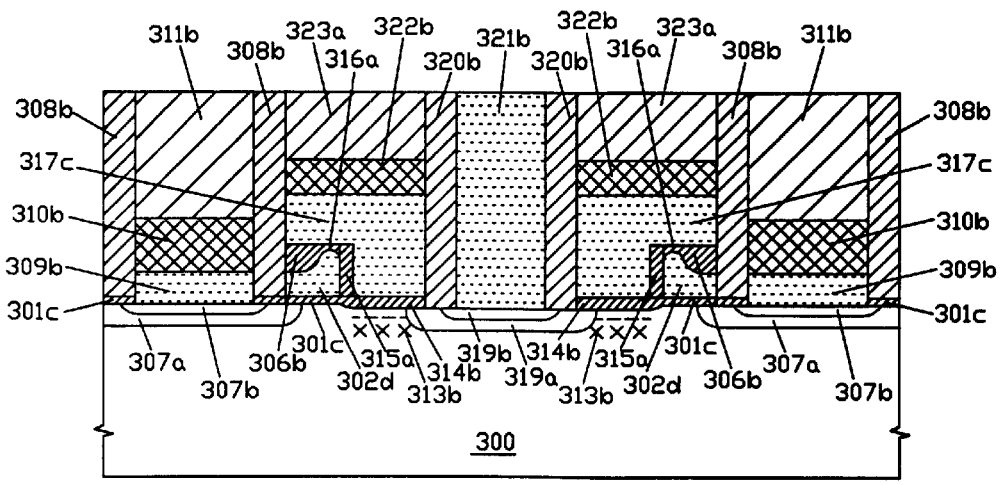
Figure 4C:
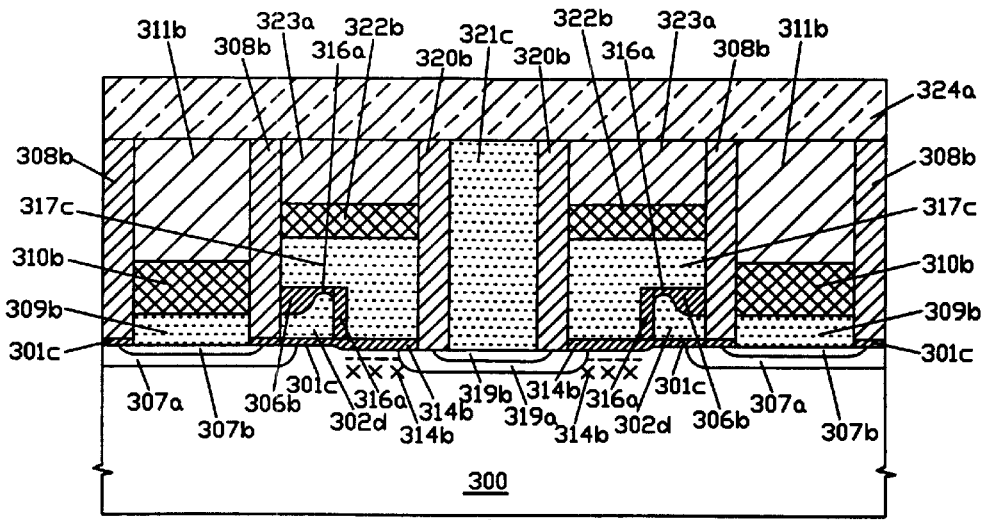

Referring now to FIG. 4A through FIG. 4C, there are shown the process steps and their cross-sectional views of fabricating a scalable split-gate flash memory cell structure and its contactless NOR-type flash memory array after FIG. 3J. There are two basic methods for forming a contactless NOR-type flash memory array. The first method is that the planarized common-drain conductive layers 321a can be implanted with a high dose of doping impurities of the second conductivity type and is then silicided with a refractory metal-silicide layer such as a titanium-disilicide (TiSi$_2$) or cobalt-disilicide (CoSi$_2$) layer using a well-known self-aligned silicidation process; a metal layer 324 is formed over a formed structure surface and the metal layer 324 together with the silicided planarized common-drain conductive layers 321a are simultaneously patterned by a masking photoresist step to form a plurality of metal bit-lines 324a integrated with silicided planarized common-drain conductive islands 321b. The metal layer 324 comprises a copper (Cu) or aluminum (Al) layer over a barrier-metal layer such as a titanium-nitride (TiN) or tantalum-nitride (TaN) layer. The masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers to eliminate misalignment. This process is simple, the parasitic capacitance between each of the plurality of metal bit-lines 324a and the control-gate conductive layer 317c being acted as a conductive word-line is larger due to a high dielectric constant of the third sidewall dielectric spacer 318a being made of silicon-nitride. Another method as described in FIG. 4A through FIG. 4C may give lower parasitic capacitance between the metal bit-line and the conductive word-line.

FIG. 4A shows that the planarized common-rain conductive layers 321a are selectively etched back slightly by using anisotropic dry etching to remove the curve portions; the pair of first sidewall dielectric spacers 308a, the first planarized thick-oxide layers 311a, and the pair of fourth sidewall dielectric spacers 320a are then etched back to the same depth; and subsequently, the third sidewall dielectric spacers 318a are removed by hot-phosphoric-acid or anisotropic dry etching.

FIG. 4B shows that a capping control-gate conductive layer 322b is formed over each of the control-gate conductive-gate layers 317c and a planarized capping-oxide layer 323a is then formed over the capping control-gate conductive layer 322b. The capping control-gate conductive layer 322b comprises a tungsten (W) or tungsten-disilicide (WSi$_2$) layer as deposited by LPCVD or sputtering and is formed by first depositing a conductive layer 322 to fill up each gap formed between the etched-back first sidewall dielectric spacer 308b and the etched-back fourth sidewall dielectric spacer 320b, then planarizing the deposited conductive layer 322 using CMP or etching back, and thereafter etching back the planarized conductive layers 322a to a predetermined thickness. The planarized capping-oxide layer 323a is preferably made of silicon-dioxide, P-glass, or BP-glass as deposited by LPCVD, HDPCVD, or PECVD and is formed by first depositing a thick-oxide layer 323 to fill up each gap formed between the etched-back first sidewall dielectric spacer 308b and the etched-back fourth sidewall dielectric spacer 320b and then planarizing the deposited thick-oxide layer 323 using CMP or etching back. Similarly, the etched-back planarized common drain conductive layer 321b can be implanted with a high dose of doping impurities of the second conductivity type and is then silicided with a refractory metal-silicide layer by using the well known self-aligned silicidation technique.

FIG. 4C shows that a metal layer 324 is formed over a formed structure surface and the metal layer 324 together with the etched-back planarized common-drain conductive layers 321b are simultaneously patterned and etched by using a masking photoresist step to form a plurality of metal bit-lines 324a integrated with etched-back planarized common-drain conductive islands 321c. As described before, the metal layer 324 comprises a copper or aluminum layer over a barrier-metal layer; and the masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers. It is clearly seen that a plurality of highly conductive word-lines 322b/317c are formed transversely to the plurality of metal bit-lines 324a and each of the plurality of metal bit-lines 324a is spaced from the plurality of highly conductive word-lines 322b/317c by a planarized capping-oxide layer 323a. It is also clearly seen that the thickness of the second masking dielectric layer 305 as described in FIG. 2C is between 10000 Angstroms and 15000 Angstroms, the thickness of the planarized capping-oxide layer 323a is between 5000 Angstroms and 10000 Angstroms, so the parasitic capacitance between each of the plurality of metal bit-lines 324a and the plurality of highly conductive word-lines 322b/317c is small.

Figure 5A:
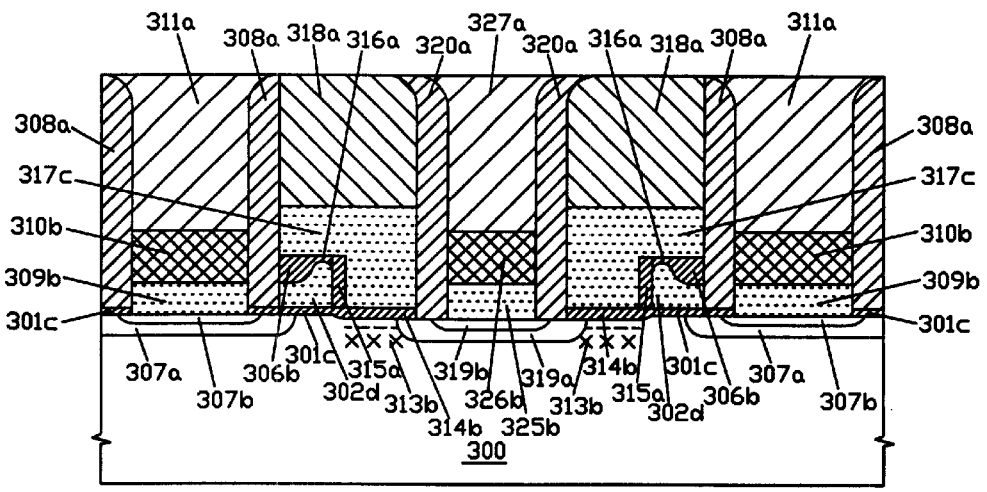
FIG. 5A through FIG. 5C show the process steps and their cross-sectional views for forming a scalable split-gate flash memory cell structure and its contactless parallel common-source/drain conductive bit-lines flash memory array of the present invention.
Figure 5B:
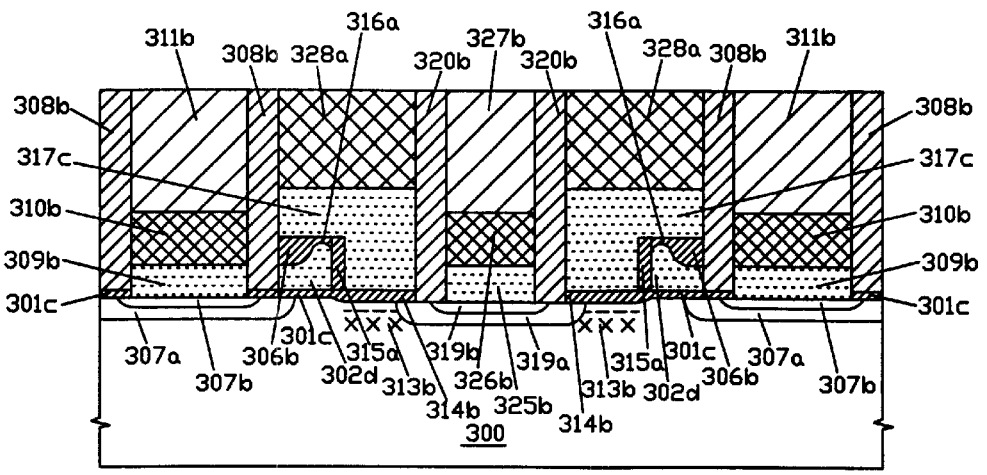
Figure 5C:
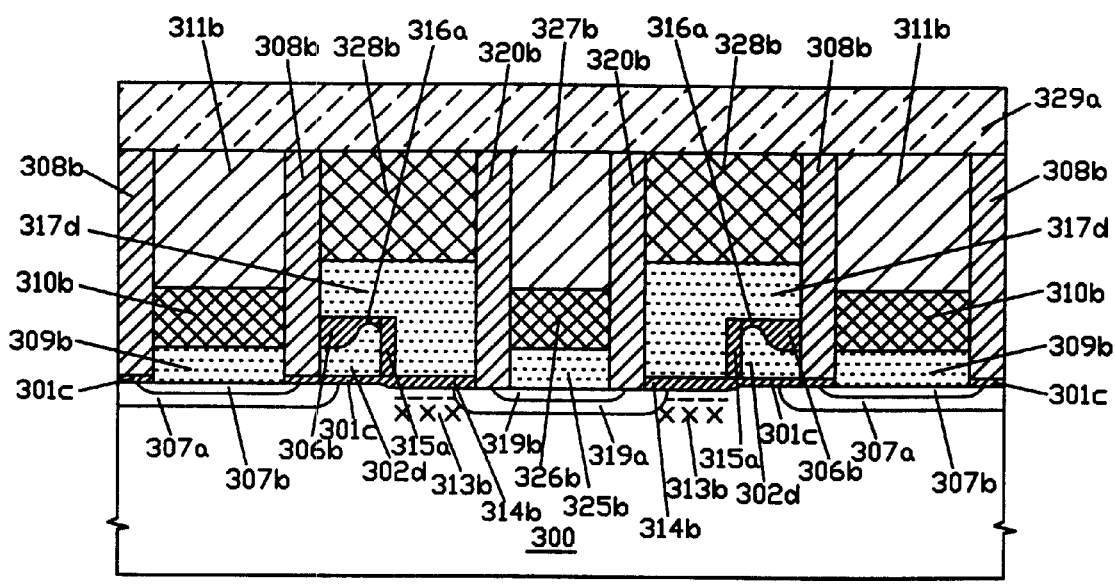

Referring now to FIG. 5A through FIG. 5C, there are shown the process steps and their cross-sectional views of fabricating a scalable split-gate flash memory cell structure and its contactless parallel common-source/drain bit-lines flash memory array after FIG. 3J.

FIG. 5A shows that the planarized common-drain conductive layers 321a are selectively etched back to a thickness approximately equal to that of the common-source conductive layer 309b and an ion-implantation process is performed by implanting a high dose of doping impurities of the second conductivity type into the common-drain conductive layer 325b; a capping common-drain conductive layer 326b is then formed over the common-drain conductive layer 325b to act as a common-drain conductive bit-line 326b/325b in each of the plurality of common-drain regions; and subsequently, a second planarized thick-oxide layer 327a is formed over the common-drain conductive bit-line 326b/325b between the pair of fourth sidewall dielectric spacers 320a. The common-drain conductive layer 325b is preferably made of doped polycrystalline-silicon as deposited by LPCVD and is formed by the same process steps as described for the common-source conductive layer 309b. The capping common-drain conductive layer 326b comprises a tungsten-disilicide or tungsten layer as deposited by LPCVD or sputtering and is formed by the same process steps as described for the capping common-source conductive layer 310b in each of the plurality of common-source regions.

FIG. 5B shows that the pair of first sidewall dielectric spacers 308a, the first planarized thick-oxide layers 311a, the pair of fourth sidewall dielectric spacers 320a, and the second planarized thick-oxide layers 327a are selectively etched back to eliminate the curve portions by using anisotropic dry etching or wet etching; the pair of third sidewall dielectric spacers 318a are then removed by using hot-phosphoric acid or anisotropic dry etching; and subsequently, a planarized control-gate conductive layer 328a is formed over the control-gate conductive layer 317c between the etched-back first sidewall dielectric spacer 308b and the etched-back fourth sidewall dielectric spacer 320b. The planarized control-gate conductive layer 328a is preferably made of tungsten or tungsten-disilicide or other metal materials being lined with a barrier-metal layer (not shown) such as a titanium-nitride (TiN) or tantalum-nitride (TaN) layer. The control-gate structure is formed by first depositing a barrier-metal layer over a formed structure surface, and a highly conductive layer 328 is formed to fill up each gap between the etched-back first sidewall dielectric spacer 308b and the, etched-back fourth sidewall dielectric spacer 320b and is then planarized by using CMP or etching back.

FIG. 5C shows that a metal layer 329 is formed over a formed structure surface and the metal layer 329 together with the planarized control-gate conductive layer 328a over the control-gate conductive layer 317c are simultaneously patterned and etched by a masking photoresist step to form a plurality of metal word-lines 329a integrated with planarized control-gate conductive islands 328b over control-gate conductive islands 317d. Similarly, the metal layer 329 comprises a copper or aluminum layer over a barrier-metal layer such as a titanium-nitride (TiN) or tantalum-nitride (TaN) layer. The masking photoresist step comprises a plurality of masking photoresist being aligned above the plurality of active regions or a plurality-of hard masking dielectric layers being aligned above the plurality of active regions and a sidewall dielectric spacer being formed over each sidewall of the plurality of hard masking dielectric layers to eliminate misalignment. It is clearly seen that the plurality of metal word-lines 329a are formed transversely to a plurality of common-source conductive bit-lines 310b/309b and a plurality of common-drain conductive bit-lines 326b/325b.

Figure 6A:
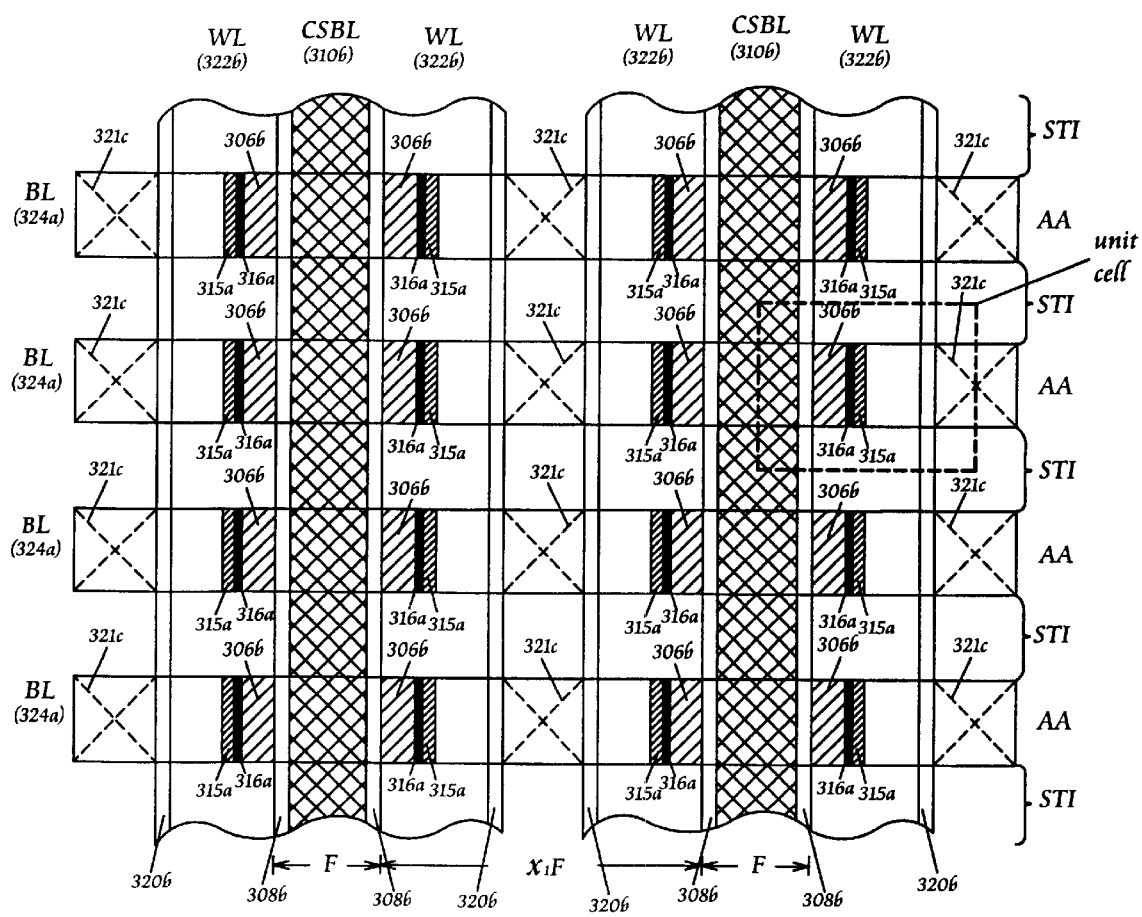

FIG. 6A shows a top plan view of a contactless NOR-type flash memory array of the present invention, in which the plurality of active regions (AA) and the plurality of STI regions (STI) are alternately formed on the semiconductor substrate 300; the plurality of conductive word-lines (WL) are formed between the plurality of common-source regions and the plurality of scalable common-drain regions; each of the plurality of common-source regions comprises a pair of first sidewall dielectric spacers 308b and a common-source conductive bus-line (CSBL) being formed between the pair of first sidewall dielectric spacers 308b; each of the plurality of scalable common-drain regions comprises a plurality of planarized common-drain conductive islands 321c being integrated with the plurality metal bit-lines 324a; a plurality of tip-cathode lines 316a are formed between the first thermal poly-oxide layers 315a and the refilled-oxide layers 306b in the floating-gate regions. As shown in FIG. 6A, the unit cell size is equal to equal to $4F^2$ if $X_1=3$; and the floating-gate region, the scalable split-gate region, and the scalable common-drain region are defined by spacer-formation techniques and are scalable.

Figure 6B:
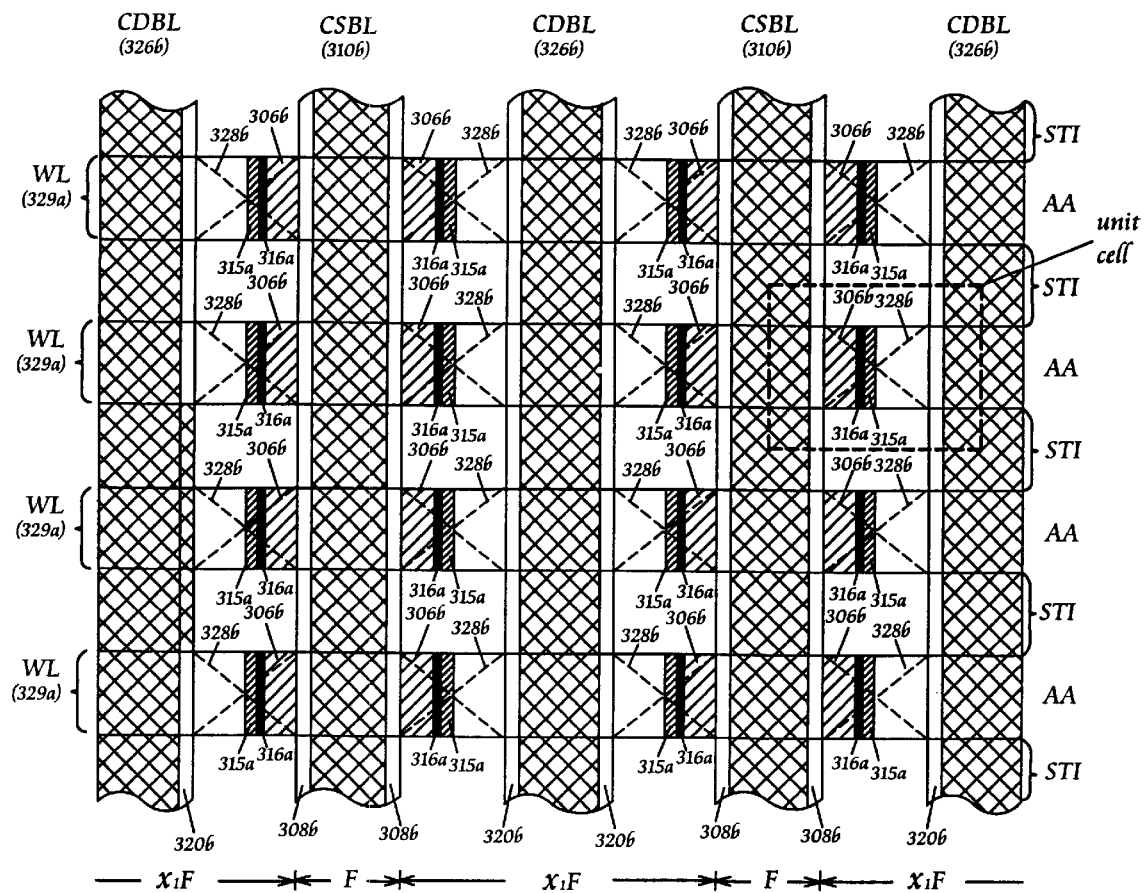

FIG. 6B shows a top plan view of a contactless parallel common-source/drain conductive bit-lines flash memory array of the present invention, in which the plurality of active regions (AA) and the plurality of STI regions (STI) are alternately formed on the semiconductor substrate 300; the plurality of common-source conductive bit-lines (CSBL) and the plurality of common-drain conductive bit-lines (CDBL) are formed alternaltely and transversely to the plurality of active regions (AA); each of the plurality of common-source conductive bit-lines (CSBL) is formed between the pair of first sidewall dielectric spacers 308b; each of the plurality of common-drain conductive bit-lines (CDBL) is formed between the pair of fourth sidewall dielectric spacers 320b; the plurality of metal word-lines (WL) integrated with planarized control-gate conductive islands 328b over control-gate conductive islands 317d are formed transversely to the plurality of common-source conductive bit-lines (CSBL) and the plurality of common-drain conductive bit-lines (CDBL); each of floating-gate regions comprises a plurality of tip-cathode lines 316a and each of the plurality of tip-cathode lines 316a is formed between the first thermal polyoxide layer 315a and the refilled-oxide layer 306b in each of the floating-gate layers. As shown in FIG. 6B, the unit cell size is equal to $4F^2$ if $X_1=3$; and the floating-gate region, the scalable split-gate region, and the scalable common-drain region are defined by spacer-formation techniques and are also scalable.

Based on the above description, the features and advantages of the scalable split-gate flash memory cell structure and its contactless flash memory arrays are summarized below:

(a) The scalable split-gate flash memory cell structure of the present invention can offer as a scalable cell size equal to $4F^2$ or smaller using spacer-formation techniques.

(b) The scalable split-gate flash memory cell structure of the present invention offers a controllable tip-cathode line for efficiently erasing stored electrons in the floating-gate layer to the control-gate conductive layer.

(c) The scalable split-gate flash memory cell structure and its contactless flash memory arrays of the present invention can be fabricated by using less critical masking steps.

(d) The contactless NOR-type flash memory array of the present invention offers a plurality of metal bit-lines integrated with planarized common-drain conductive islands, a plurality of highly conductive common-source bus-lines with less parasitic junction capacitance, and a plurality of conductive word-lines for high-speed read/write/erase operations.

(e) The contactless parallel common-source/drain conductive bit-lines flash memory array of the present invention offers a plurality of metal word-lines integrated with planarized control-gate conductive islands over control-gate conductive islands and a plurality of common-source/drain conductive bit-lines with less parasitic junction capacitance for high speed read/write/erase operations.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A scalable split-gate flash memory cell structure, comprising:
   - a semiconductor substrate of a first conductivity type having an active region formed between two shallow-trench-isolation (STI) regions:
     - a cell region comprising a common-source region, a scalable split-gate region, and a scalable common-drain region, wherein said scalable split-gate region being formed between said common-source region and said, scalable common-drain region is defined by a third sidewall dielectric spacer being formed over an outer sidewall of said common-source region;
     - said common-source region being formed in a side portion of said scalable split-gate region comprising a common-source diffusion region of a second conductivity type being formed in said semiconductor substrate of said active region, a first sidewall dielectric spacer being formed over a sidewall of said scalable split-gate region, and a first flat bed being formed outside of said first sidewall dielectric spacer, wherein said first flat bed is formed by said common-source diffusion region in said active region and two fifth raised field-oxide layers in said two STI regions;
     - said scalable common-drain region being formed in another side portion of said scalable split-gate region comprising a common-drain diffusion region of said second conductivity type being formed in said semiconductor substrate of said active region, a fourth sidewall dielectric spacer being formed over another sidewall of said scalable split-gate region, and a second flat bed being formed outside of said fourth sidewall dielectric spacer, wherein said second flat bed is formed by said common-drain diffusion region in said active region and two sixth raised field-oxide layers in said two STI regions;
     - said scalable split-gate region comprising a floating-gate region being defined by a second sidewall dielectric spacer formed over an outer sidewall of said common-source region and a select-gate region being formed between said floating-gate region and said scalable common-drain region, wherein said floating-gate region comprises a floating-gate structure being formed over a tunneling-dielectric layer in said active region and a portion of a control-gate conductive layer or a control-gate conductive island being at least formed over said floating-gate structure and said select-gate region comprises another portion of said control-gate conductive layer or said control-gate conductive island being at least formed over a gate-dielectric layer in said active region; and
     said floating-gate structure comprising a tip-cathode line being formed between a first thermal poly-oxide layer formed over its outer sidewall near said select-gate region and a refilled-oxide layer formed in its upper corner portion near said common-source region, wherein said tip-cathode line has a second poly-oxide layer being formed over its top portion to act as a tunneling-oxide layer.

2. The scalable split-gate flash memory cell structure according to claim 1, wherein a common-source conductive bus-line comprising a doped polycrystalline-silicon layer being implanted with a high-dose of doping impurities of said second conductivity type and capped with a tungsten-disilicide ($WSi_2$) or tungsten (W) layer is formed over said first flat bed and a first planarized thick-oxide layer is formed over said common-source conductive bus-line.

3. The scalable split-gate flash memory cell structure according to claim 1, wherein said control-gate conductive layer comprising a doped polycrystalline-silicon layer being implanted with a high dose of doping impurities of said second conductivity type is capped with a tungsten-disilicide ($WSi_2$) or tungsten (W) layer to act as a conductive word-line and a planarized capping-oxide layer is formed over said conductive word-line for forming a first-type scalable split-gate flash memory cell.

4. The scalable split-gate flash memory cell structure according to claim 1, wherein said control-gate conductive island comprising a doped polycrystalline-silicon island being implanted with a high-dose of doping impurities of said second conductivity type is capped with a planarized control-gate conductive island being made of tungsten-disilicide ($WSi_2$) or tungsten (W) and a metal word-line integrated with said planarized control-gate conductive island over said control-gate conductive island are simultaneously patterned by a masking photoresist being aligned above said active region or a hard masking dielectric layer being aligned above said active region and a sidewall dielectric spacer being formed over each sidewall of said hard masking dielectric layer for forming a second-type scalable split-gate flash memory cell.

5. The scalable split-gate flash memory cell structure according to claim 1, wherein planarized common-drain conductive island comprising a doped polycrystalline-silicon island being implanted with a high dose of doping impurities of said second conductivity type is at least formed over said common-drain diffusion region in said second flat bed and a metal bit-line integrated with said planarized common-drain conductive island are simultaneously patterned by a masking photoresist being aligned above said active region or a hard masking dielectric layer being formed above said active region and a sidewall dielectric spacer being formed over each sidewall of said hard masking dielectric layer for forming a first-type scalable split-gate flash memory cell.

6. The scalable split-gate flash memory cell structure according to claim 1, wherein a common-drain conductive bus-line comprising a doped polycrystalline-silicon layer being implanted with a high dose of doping impurities of said second conductivity type and capped with a tungsten-disilicide ($WSi_2$) or tungsten (W) layer is formed over said second flat bed and a second planarized thick-oxide layer is formed over said common-drain conductive bus-line for forming a second-type scalable split-gate flash memory cell.

7. The scalable split-gate flash memory cell structure according to claim 1, wherein said common-source diffusion region comprises a shallow heavily-doped common-source diffusion region being formed within a lightly-doped common-source diffusion region and said common-drain diffusion region comprises a shallow heavily-doped common-drain diffusion region being formed within a lightly-doped common-drain diffusion region.

8. The scalable split-gate flash memory cell structure according to claim 1, wherein an implant region of said first conductivity type being formed under said gate-dielectric layer in said select-gate region comprises a shallow implant region for threshold-voltage adjustment and a deep implant region for forming a punch-through stop.

9. A contactless scalable split-gate flash memory array, comprising:

a semiconductor substrate of a first conductivity type having a shallow-trench-isolation (STI) structure formed, wherein said STI structure comprises a plurality of active regions and a plurality of STI regions being formed alternately on said semiconductor substrate;

a plurality of common-source regions and a plurality of scalable regions being alternately formed on said STI structure and transversely to the plurality of active regions, wherein each of the plurality of scalable regions comprises a pair of scalable split-gate regions being defined by a pair of third sidewall dielectric spacers formed over outer sidewalls of nearby common-source regions and a scalable common-drain region being formed between said pair of scalable split-gate regions;

each of the plurality of common-source regions comprising a plurality of common-source diffusion regions of a second conductivity type being formed in said semiconductor substrate of the plurality of active regions, a pair of first sidewall dielectric spacers being formed over outer sidewalls of nearby scalable split-gate regions, and a first flat bed being alternately formed by said common-source diffusion region and a fifth raised field-oxide layer between said pair of first sidewall dielectric spacers, wherein a common-source conductive bus-line is formed over said first flat bed and a first planarized thick-oxide layer is formed over said common-source conductive bus-line between said pair of first sidewall dielectric spacers;

said scalable common-drain region comprising a plurality of common-drain diffusion regions of said second conductivity type being formed in said semiconductor substrate of the plurality of active regions, a pair of fourth sidewall dielectric spacers being formed over outer sidewalls of nearby scalable split-gate regions, and a second flat bed being alternately formed by said common-drain diffusion region and a sixth raised field-oxide layer between said pair of fourth sidewall dielectric spacers, wherein a plurality of planarized common-drain conductive islands are at least formed over the plurality of common-drain diffusion regions in said second flat bed;

each of said pair of scalable split-gate regions comprising a floating-gate region being defined by each of a pair of second sidewall dielectric spacers formed over outer sidewalls of nearby common-source regions and a select-gate region being formed between said floating-gate region and said scalable common-drain region, wherein said floating-gate region comprises a plurality of floating-gate structures being formed over tunneling-dielectric layers in the plurality of active regions and a portion of a control-gate conductive layer being at least formed over the plurality of floating-gate structures and said select-gate region comprises another portion of said control-gate conductive layer being at least formed over gate-dielectric layers in the plurality of active regions;

each of the plurality of floating-gate structure comprising a tip-cathode line being formed between a first thermal poly-oxide layer formed over its outer sidewall and a refilled-oxide layer formed in its upper corner portion near said common-source region, wherein said tip-cathode line has a second poly-oxide layer being formed over its top portion to act as a tunneling-oxide layer;

a capping control-gate conductive layer being formed over said control-gate conductive layer to act as a conductive word-line, wherein a planarized capping-oxide layer is formed over said capping control-gate conductive layer; and a plurality of metal bit-lines integrated with said planarized common-drain conductive islands being simultaneously patterned by a masking photoresist step, wherein said masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

10. The contactless scalable split-gate flash memory array according to claim 9, wherein said control-gate conductive layer comprises a doped polycrystalline-silicon layer being implanted with a high dose of doping impurities of said second conductivity type and said capping control-gate conductive layer comprises a tungsten-disilicide ($WSi_2$) or tungsten layer.

11. The contactless scalable split-gate flash memory array according to claim 9, wherein said planarized common-drain conductive island comprises a doped polycrystalline-silicon island being implanted with a high dose of doping impurities of said second conductivity type and silicided with a refractory metal-disilicide layer such as a titanium-disilicide ($TiSi_2$) or cobalt-disilicide ($CoSi_2$) layer and said metal bit-line comprises a copper (Cu) or aluminum (Al) layer being formed over a barrier-metal layer such as a titanium-nitride (TiN) or tantalum-nitride (TaN) layer.

12. The contactless scalable split-gate flash memory array according to claim 9, wherein said common-source conductive bus-line comprises a doped polycrystalline-silicon layer being implanted with a high-dose of doping impurities of said second conductivity type and capped with a tungsten-disilicide ($WSi_2$) or tungsten (W) layer.

13. The contactless scalable split-gate flash memory array according to claim 9, wherein an implant region of said fire conductivity type being formed under said gate-dielectric layer comprises a shallow implant region for threshold-voltage adjustment and a deep implant region for forming a punch-through stop.

14. A contactless scalable split-gate flash memory array, comprising:

a semiconductor substrate of a first conductivity type having a shallow-trench-isolation (STI) structure formed, wherein said STI structure comprises a plurality of active regions and a plurality of SIT regions being alternately formed on said semiconductor substrate;

a plurality of common-source regions and a plurality of scalable regions being alternately formed on said STI structure and transversely to the plurality of active regions, wherein each of the plurality of scalable regions comprises a pair of scalable split-gate regions and a scalable common-drain region being formed between said pair of scalable split-gate regions;

each of the plurality of common-source regions comprising a plurality of common-source diffusion regions of a second conductivity type being formed in said semiconductor substrate of the plurality of active regions, a pair of first sidewall dielectric spacers being formed over outer sidewalls of nearby scalable split-gate regions, and a first flat bed being alternately formed by said common-source diffusion region and a fifth raised field-oxide layer between said pair of first sidewall dielectric spacers, wherein a common-source conductive bus-line is formed over said first flat bed and a first planarized thick-oxide layer is formed over said common-source conductive bus-line between said pair of first sidewall dielectric spacers;

said scalable common-drain region comprising a plurality of common-drain diffusion regions of said second conductivity type being formed in said semiconductor substrate of the plurality of active regions, a pair of fourth sidewall dielectric spacers being formed over outer sidewalls of nearby scalable split-gate regions, and a second flat bed being alternately formed by said common-drain diffusion region and a sixth raised field-oxide layer between said pair of fourth sidewall dielectric spacers, wherein a common-drain conductive bus-line is formed over said second flat bed and a second planarized thick-oxide layer is formed over said common-drain conductive bus-line between said pair of fourth sidewall dielectric spacers;

each of said pair of scalable split-gate regions comprising a floating-gate region being defined by each of a pair of second sidewall dielectric spacers formed over outer sidewalls of nearby common-source regions and a select-gate region being formed between said floating-gate region and said scalable common-drain region, wherein said floating-gate region comprises a plurality of floating-gate structures being formed over tunneling-dielectric layers in the plurality of active regions and a portion of a control-gate conductive island being at least formed over each of the plurality of floating-gate structures and said select-gate region comprises another portion of said control-gate conductive island being at least formed over a gate-dielectric layer in each of the plurality of active regions;

each of the plurality of floating-gate structures comprises a tip-cathode line being formed between a first thermal poly-oxide layer formed over its outer sidewall and a refilled-oxide layer formed in its upper corner portion near said common-source region, wherein said tip-cathode line has a second poly-oxide layer being formed over its tip to act as a tunneling-oxide layer;

a planarized control-gate conductive island being formed over said control-gate conductive island; and a plurality of metal word-lines integrated with said planarized control-gate conductive islands over said control-gate conductive islands being simultaneously patterned by a masking photoresist step, wherein said masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

15. The contactless scalable split-gate flash memory array according to claim 14, wherein said common-source conductive bus-line comprises a doped polycrystalline-silicon layer being implanted with a high dose of doping impurities of said second conductivity type and capped with a tungsten-disilicide ($WSi_2$) or tungsten (W) layer.

16. The contactless scalable split-gate flash memory array according to claim 14, where said common-drain conductive bus-line comprises a doped polycrystalline-silicon layer being implanted with a high dose of doping impurities of said second conductivity type and capped with a tungsten-disilicide ($WSi_2$) or tungsten (W) layer.

17. The contactless scalable split-gate flash memory array according to claim 14, wherein said control-gate conductive island comprises a doped polycrystalline-silicon island and said planarized control-gate conductive island comprises a tungsten-disilicide ($WSi_2$) or tungsten (W) island.

18. The contactless scalable split-gate flash memory array according to claim 14, wherein said metal word-line comprises a copper (Cu) or aluminum (Al) layer being formed over a barrier-metal layer such as a titanium-nitride (TiN) or tantalum-nitride (TaN) layer.

19. The contactless scalable split-gate flash memory array according to claim 14, wherein an implant region of said first conductivity type comprises a shallow implant region for threshold-voltage adjustment and a deep implant region for forming a punch-through stop.

20. The contactless scalable split-gate flash memory array according to claim 14, wherein said common-source/drain diffusion region comprises a shallow heavily-doped common-source/drain diffusion region being formed within a lightly-doped common-source/drain diffusion region.

* * * * *